(12) United States Patent
Young et al.

(10) Patent No.: US 8,790,499 B2
(45) Date of Patent: Jul. 29, 2014

(54) PROCESS KIT COMPONENTS FOR TITANIUM SPUTTERING CHAMBER

(75) Inventors: Donny Young, San Jose, CA (US); Alan Alexander Ritchie, Pleasanton, CA (US); Ilyoung (Richard) Hong, San Jose, CA (US); Kathleen A. Scheible, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2309 days.

(21) Appl. No.: 11/558,928

(22) Filed: Nov. 12, 2006

(65) Prior Publication Data

US 2007/0173059 A1 Jul. 26, 2007

Related U.S. Application Data

(60) Provisional application No. 60/739,658, filed on Nov. 25, 2005, provisional application No. 60/788,378, filed on Mar. 30, 2006.

(51) Int. Cl.
*C23C 14/34* (2006.01)

(52) U.S. Cl.
USPC .................. 204/298.11; 204/298.15

(58) Field of Classification Search
USPC .............. 204/298.01, 298.02, 298.11, 298.15
See application file for complete search history.

(56) References Cited

U.S. PATENT DOCUMENTS

| | | | |
|---|---|---|---|
| 3,482,082 A | 12/1969 | Isreeli | |
| 3,679,460 A | 7/1972 | Reid | |
| 3,716,432 A | 2/1973 | Jensen | |
| 3,725,220 A | 4/1973 | Kessler et al. | |
| 3,748,253 A | 7/1973 | Provenzano | |
| 4,384,918 A | 5/1983 | Abe | |
| 4,412,133 A | 10/1983 | Eckes et al. | |
| 4,415,421 A | 11/1983 | Sasanuma | |
| 4,419,201 A | 12/1983 | Levinstein et al. | |
| 4,430,173 A | 2/1984 | Boudot et al. | |

(Continued)

FOREIGN PATENT DOCUMENTS

| | | |
|---|---|---|
| CN | 1527887 | 9/2004 |
| DE | 19719133 | 11/1998 |

(Continued)

OTHER PUBLICATIONS

Daviet, et al., "Electrostatic Clamping Applied to Semiconductor Plasma Processing-I. Theoretical Modeling," J. Electrochem. Soc., 140(11):3245-3255 (Nov. 1993).

(Continued)

*Primary Examiner* — Keith Hendricks
*Assistant Examiner* — John Brayton
(74) *Attorney, Agent, or Firm* — Ashok K. Janah; Janah & Associates, P.C.

(57) ABSTRACT

A process kit for a sputtering chamber comprises a deposition ring, cover ring, and a shield assembly, for placement about a substrate support in a sputtering chamber. The deposition ring comprising an annular band with an inner lip extending transversely, a raised ridge substantially parallel to the substrate support, an inner open channel, and a ledge radially outward of the raised ridge. A cover ring at least partially covers the deposition ring, the cover ring comprising an annular plate comprising a footing which rests on a surface about the substrate support, and downwardly extending first and second cylindrical walls.

16 Claims, 3 Drawing Sheets

(56) References Cited

U.S. PATENT DOCUMENTS

| | | | |
|---|---|---|---|
| 4,480,284 A | 10/1984 | Tojo et al. |
| 4,491,496 A | 1/1985 | Laporte et al. |
| 4,606,802 A | 8/1986 | Kobayashi et al. |
| 4,645,218 A | 2/1987 | Ooshio et al. |
| 4,665,463 A | 5/1987 | Ward et al. |
| 4,717,462 A | 1/1988 | Homma et al. |
| 4,832,781 A | 5/1989 | Mears |
| 4,872,250 A | 10/1989 | De Marco |
| 4,872,964 A | 10/1989 | Suzuki et al. |
| 4,913,784 A | 4/1990 | Bogenschutz et al. |
| 4,995,958 A | 2/1991 | Anderson et al. |
| 5,055,964 A | 10/1991 | Logan et al. |
| 5,064,511 A | 11/1991 | Gobbetti |
| 5,104,834 A | 4/1992 | Watanabe et al. |
| 5,117,121 A | 5/1992 | Watanabe et al. |
| 5,151,845 A | 9/1992 | Watanabe et al. |
| 5,166,856 A | 11/1992 | Liporace et al. |
| 5,191,506 A | 3/1993 | Logan et al. |
| 5,215,639 A | 6/1993 | Boys |
| 5,258,047 A | 11/1993 | Tokisue et al. |
| 5,270,266 A | 12/1993 | Hirano et al. |
| 5,275,683 A | 1/1994 | Arami et al. |
| 5,280,156 A | 1/1994 | Niori et al. |
| 5,314,597 A | 5/1994 | Harra |
| 5,315,473 A | 5/1994 | Collins et al. |
| 5,324,053 A | 6/1994 | Kubota et al. |
| 5,325,261 A | 6/1994 | Horwitz |
| 5,350,479 A | 9/1994 | Collins et al. |
| 5,382,469 A | 1/1995 | Kubota et al. |
| 5,391,275 A * | 2/1995 | Mintz ............... 204/192.32 |
| 5,401,319 A | 3/1995 | Banholzer et al. |
| 5,407,551 A | 4/1995 | Sieck et al. |
| 5,409,590 A | 4/1995 | Hurwitt et al. |
| 5,418,071 A | 5/1995 | Satou et al. |
| 5,429,711 A | 7/1995 | Watanabe et al. |
| 5,433,835 A | 7/1995 | Demaray et al. |
| 5,435,965 A | 7/1995 | Mashima et al. |
| 5,458,759 A | 10/1995 | Hosokawa et al. |
| 5,460,694 A | 10/1995 | Schapira et al. |
| 5,463,526 A | 10/1995 | Mundt |
| 5,474,649 A | 12/1995 | Kava et al. |
| 5,487,822 A | 1/1996 | Demaray et al. |
| 5,490,913 A | 2/1996 | Schertler et al. |
| 5,512,078 A | 4/1996 | Griffin |
| 5,536,723 A | 7/1996 | Loscalzo et al. |
| 5,542,559 A | 8/1996 | Kawakami et al. |
| 5,549,802 A | 8/1996 | Guo |
| 5,587,039 A | 12/1996 | Salimian et al. |
| 5,628,889 A | 5/1997 | Gardell et al. |
| 5,643,422 A | 7/1997 | Yamada |
| 5,684,669 A | 11/1997 | Collins et al. |
| 5,685,914 A | 11/1997 | Hills et al. |
| 5,685,959 A | 11/1997 | Bourez et al. |
| 5,695,825 A | 12/1997 | Scruggs |
| 5,700,179 A | 12/1997 | Hasegawa et al. |
| 5,720,818 A | 2/1998 | Donde et al. |
| 5,762,748 A | 6/1998 | Banholzer et al. |
| 5,772,860 A | 6/1998 | Sawada et al. |
| 5,792,562 A | 8/1998 | Collins et al. |
| 5,800,725 A | 9/1998 | Kato et al. |
| 5,803,342 A | 9/1998 | Kardokus |
| 5,808,270 A | 9/1998 | Marantz et al. |
| 5,812,362 A | 9/1998 | Ravi |
| 5,821,166 A | 10/1998 | Hajime et al. |
| 5,824,197 A | 10/1998 | Tanaka |
| 5,830,327 A | 11/1998 | Kolenkow |
| 5,858,100 A | 1/1999 | Maeda et al. |
| 5,876,573 A | 3/1999 | Moslehi et al. |
| 5,879,523 A | 3/1999 | Wang et al. |
| 5,879,524 A | 3/1999 | Hurwitt et al. |
| 5,886,863 A | 3/1999 | Nagasaki et al. |
| 5,903,428 A | 5/1999 | Grimard et al. |
| 5,910,338 A | 6/1999 | Donde |
| 5,916,378 A | 6/1999 | Bailey et al. |
| 5,916,454 A | 6/1999 | Richardson et al. |
| 5,920,764 A | 7/1999 | Hanson |
| 5,942,041 A | 8/1999 | Lo et al. |
| 5,942,445 A | 8/1999 | Kato et al. |
| 5,948,288 A | 9/1999 | Treves et al. |
| 5,951,374 A | 9/1999 | Kato et al. |
| 5,953,827 A | 9/1999 | Or et al. |
| 5,963,778 A | 10/1999 | Stellrecht |
| 5,976,327 A | 11/1999 | Tanaka |
| 6,010,583 A | 1/2000 | Annavarapu et al. |
| 6,015,465 A | 1/2000 | Kholodenko et al. |
| 6,026,666 A | 2/2000 | Zimmermann et al. |
| 6,051,114 A | 4/2000 | Yao et al. |
| 6,059,945 A | 5/2000 | Fu et al. |
| 6,071,389 A | 6/2000 | Zhang |
| 6,073,830 A | 6/2000 | Hunt et al. |
| 6,074,488 A | 6/2000 | Roderick et al. |
| 6,086,735 A | 7/2000 | Gilman et al. |
| 6,108,189 A | 8/2000 | Weldon et al. |
| 6,113,761 A | 9/2000 | Kardokus et al. |
| 6,120,640 A | 9/2000 | Shih et al. |
| 6,143,432 A | 11/2000 | de Rochemont et al. |
| 6,146,509 A | 11/2000 | Aragon |
| 6,149,784 A | 11/2000 | Su et al. |
| 6,150,762 A | 11/2000 | Kim et al. |
| 6,152,071 A | 11/2000 | Akiyama et al. |
| 6,159,299 A | 12/2000 | Koai et al. |
| 6,162,297 A | 12/2000 | Mintz et al. |
| 6,170,429 B1 | 1/2001 | Schoepp et al. |
| 6,179,973 B1 | 1/2001 | Lai et al. |
| 6,183,614 B1 | 2/2001 | Fu |
| 6,183,686 B1 | 2/2001 | Bardus et al. |
| 6,190,516 B1 | 2/2001 | Xiong et al. |
| 6,198,067 B1 | 3/2001 | Ikeda et al. |
| 6,199,259 B1 | 3/2001 | Demaray et al. |
| 6,221,217 B1 | 4/2001 | Moslehi et al. |
| 6,227,435 B1 | 5/2001 | Lazarz et al. |
| 6,238,528 B1 | 5/2001 | Xu et al. |
| 6,248,667 B1 | 6/2001 | Kim et al. |
| 6,250,251 B1 | 6/2001 | Akiyama et al. |
| 6,251,242 B1 | 6/2001 | Fu et al. |
| 6,269,670 B2 | 8/2001 | Koestermeier |
| 6,274,008 B1 | 8/2001 | Gopalraja et al. |
| 6,276,997 B1 | 8/2001 | Li |
| 6,277,249 B1 | 8/2001 | Gopalraja et al. |
| 6,277,253 B1 | 8/2001 | Narasimhan et al. |
| 6,277,263 B1 | 8/2001 | Chen |
| 6,283,357 B1 | 9/2001 | Kulkarni et al. |
| 6,284,093 B1 | 9/2001 | Ke et al. |
| 6,284,628 B1 | 9/2001 | Kuwahara et al. |
| 6,287,437 B1 | 9/2001 | Pandhumsoporn et al. |
| 6,299,740 B1 | 10/2001 | Hieronymi et al. |
| 6,306,226 B1 | 10/2001 | Lino et al. |
| 6,306,498 B1 | 10/2001 | Yuuki et al. |
| 6,315,840 B1 | 11/2001 | Onoda et al. |
| 6,338,781 B1 | 1/2002 | Sichmann et al. |
| 6,338,906 B1 | 1/2002 | Ritland et al. |
| 6,340,415 B1 | 1/2002 | Raaijmakers et al. |
| 6,344,114 B1 | 2/2002 | Sichmann et al. |
| 6,365,010 B1 | 4/2002 | Hollars |
| 6,372,609 B1 | 4/2002 | Aga |
| 6,387,809 B2 | 5/2002 | Toyama |
| 6,406,599 B1 | 6/2002 | Subramani et al. |
| 6,413,382 B1 | 7/2002 | Wang et al. |
| 6,416,634 B1 | 7/2002 | Mostovoy et al. |
| 6,419,806 B1 | 7/2002 | Holcomb et al. |
| 6,423,175 B1 | 7/2002 | Huang et al. |
| 6,436,251 B2 | 8/2002 | Gopalraja et al. |
| 6,440,221 B2 | 8/2002 | Shamouilian et al. |
| 6,447,853 B1 | 9/2002 | Suzuki et al. |
| 6,464,794 B1 | 10/2002 | Park et al. |
| 6,475,336 B1 | 11/2002 | Hubacek |
| 6,482,302 B1 | 11/2002 | Li et al. |
| 6,500,321 B1 | 12/2002 | Ashtiani et al. |
| 6,506,312 B1 | 1/2003 | Bottomfield |
| 6,555,471 B2 | 4/2003 | Sandhu et al. |
| 6,558,505 B2 | 5/2003 | Suzuki et al. |
| 6,576,909 B2 | 6/2003 | Donaldson et al. |
| 6,579,431 B1 | 6/2003 | Bolcavage et al. |
| 6,599,405 B2 | 7/2003 | Hunt et al. |

(56) References Cited

U.S. PATENT DOCUMENTS

| | | |
|---|---|---|
| 6,619,537 B1 | 9/2003 | Zhang et al. |
| 6,620,736 B2 | 9/2003 | Drewery |
| 6,623,597 B1 | 9/2003 | Han et al. |
| 6,623,610 B1 | 9/2003 | Onishi |
| 6,627,050 B2 | 9/2003 | Miller et al. |
| 6,652,668 B1 | 11/2003 | Perry et al. |
| 6,656,535 B2 | 12/2003 | He et al. |
| 6,660,135 B2 | 12/2003 | Yu et al. |
| 6,708,870 B2 | 3/2004 | Koenigsmann et al. |
| 6,709,557 B1 | 3/2004 | Kailasam et al. |
| 6,716,321 B2 | 4/2004 | Gilmore et al. |
| 6,743,340 B2 | 6/2004 | Fu |
| 6,749,103 B1 | 6/2004 | Ivanov et al. |
| 6,776,879 B2 | 8/2004 | Yamamoto et al. |
| 6,777,045 B2 * | 8/2004 | Lin et al. .................. 428/34.6 |
| 6,797,131 B2 * | 9/2004 | Liu et al. ................. 204/192.38 |
| 6,797,362 B2 | 9/2004 | Parfeniuk et al. |
| 6,824,652 B2 | 11/2004 | Park |
| 6,840,427 B2 | 1/2005 | Ivanov |
| 6,848,608 B2 | 2/2005 | Wickersham, Jr. |
| 6,858,116 B2 | 2/2005 | Okabe et al. |
| 6,872,284 B2 | 3/2005 | Ivanov et al. |
| 6,887,356 B2 | 5/2005 | Ford et al. |
| 6,899,798 B2 | 5/2005 | Weldon et al. |
| 6,902,627 B2 | 6/2005 | Brueckner et al. |
| 6,916,407 B2 | 7/2005 | Vosser et al. |
| 6,933,025 B2 | 8/2005 | Lin et al. |
| 6,955,852 B2 | 10/2005 | Ivanov |
| 6,992,261 B2 | 1/2006 | Kachalov et al. |
| 7,026,009 B2 | 4/2006 | Lin et al. |
| 7,041,200 B2 * | 5/2006 | Le et al. .................. 204/192.12 |
| 7,063,773 B2 | 6/2006 | Ivanov et al. |
| 7,131,883 B2 | 11/2006 | Park et al. |
| 7,146,703 B2 | 12/2006 | Ivanov |
| 7,520,969 B2 * | 4/2009 | Miller .................. 204/298.11 |
| 7,579,067 B2 | 8/2009 | Lin et al. |
| 7,618,769 B2 | 11/2009 | Brueckner et al. |
| 7,713,379 B2 | 5/2010 | Rogers |
| 2001/0001367 A1 | 5/2001 | Koestermeier |
| 2001/0033706 A1 | 10/2001 | Shimomura et al. |
| 2001/0035237 A1 | 11/2001 | Nagano et al. |
| 2001/0035238 A1 | 11/2001 | Nagano et al. |
| 2001/0045353 A1 | 11/2001 | Hieronymi et al. |
| 2002/0014289 A1 | 2/2002 | Nagano et al. |
| 2002/0029745 A1 | 3/2002 | Nagaiwa et al. |
| 2002/0033330 A1 | 3/2002 | Demaray et al. |
| 2002/0053513 A1 * | 5/2002 | Stimson et al. .......... 204/298.15 |
| 2002/0076490 A1 | 6/2002 | Chiang et al. |
| 2002/0079217 A1 | 6/2002 | Buehler |
| 2002/0086118 A1 * | 7/2002 | Chang et al. .................. 427/447 |
| 2002/0090464 A1 | 7/2002 | Jiang et al. |
| 2002/0100680 A1 | 8/2002 | Yamamoto et al. |
| 2002/0121436 A1 | 9/2002 | Gogh et al. |
| 2003/0026917 A1 | 2/2003 | Lin et al. |
| 2003/0047464 A1 | 3/2003 | Sun et al. |
| 2003/0116276 A1 | 6/2003 | Weldon et al. |
| 2003/0118731 A1 | 6/2003 | He et al. |
| 2003/0127319 A1 | 7/2003 | Demaray et al. |
| 2003/0168168 A1 | 9/2003 | Liu et al. |
| 2003/0173526 A1 | 9/2003 | Popiolkowski et al. |
| 2003/0185965 A1 | 10/2003 | Lin et al. |
| 2003/0196890 A1 | 10/2003 | Le et al. |
| 2003/0218054 A1 | 11/2003 | Koenigsmann et al. |
| 2004/0056070 A1 | 3/2004 | Ivanov |
| 2004/0056211 A1 | 3/2004 | Popiolkowski et al. |
| 2004/0079634 A1 | 4/2004 | Wickersham et al. |
| 2004/0099285 A1 | 5/2004 | Wang et al. |
| 2004/0113364 A1 | 6/2004 | Ivanov |
| 2004/0173314 A1 | 9/2004 | Nishio et al. |
| 2004/0222088 A1 | 11/2004 | Subramani et al. |
| 2004/0245098 A1 | 12/2004 | Eckerson |
| 2004/0256226 A1 | 12/2004 | Wickersham |
| 2004/0261946 A1 | 12/2004 | Endoh et al. |
| 2005/0011749 A1 | 1/2005 | Kachalov et al. |
| 2005/0048876 A1 | 3/2005 | West et al. |
| 2005/0061857 A1 | 3/2005 | Hunt et al. |
| 2005/0067469 A1 | 3/2005 | Facey et al. |
| 2005/0087305 A1 | 4/2005 | Nishio et al. |
| 2005/0092604 A1 | 5/2005 | Ivanov |
| 2005/0115045 A1 | 6/2005 | Koenigsmann et al. |
| 2005/0133361 A1 | 6/2005 | Ding et al. |
| 2005/0147150 A1 | 7/2005 | Wickersham et al. |
| 2005/0161322 A1 | 7/2005 | Smathers |
| 2005/0172984 A1 | 8/2005 | Schweitzer et al. |
| 2005/0178653 A1 | 8/2005 | Fisher |
| 2005/0211548 A1 | 9/2005 | Gung et al. |
| 2005/0282358 A1 | 12/2005 | Di Cioccio et al. |
| 2006/0005767 A1 | 1/2006 | Tsai et al. |
| 2006/0070876 A1 | 4/2006 | Wu et al. |
| 2006/0108217 A1 | 5/2006 | Krempel-Hesse et al. |
| 2006/0188742 A1 | 8/2006 | West et al. |
| 2006/0283703 A1 | 12/2006 | Lee et al. |
| 2006/0292310 A1 | 12/2006 | Le et al. |
| 2007/0102286 A1 * | 5/2007 | Scheible et al. .......... 204/298.01 |
| 2007/0125646 A1 | 6/2007 | Young et al. |
| 2007/0170052 A1 | 7/2007 | Ritchie et al. |
| 2007/0215463 A1 | 9/2007 | Parkhe et al. |
| 2007/0246346 A1 | 10/2007 | Subramani et al. |
| 2008/0011425 A1 | 1/2008 | Nishio et al. |
| 2008/0011716 A1 | 1/2008 | Nishio et al. |
| 2008/0038481 A1 | 2/2008 | West et al. |
| 2008/0078326 A1 | 4/2008 | Sung et al. |
| 2008/0178801 A1 | 7/2008 | Pavloff et al. |
| 2008/0257263 A1 | 10/2008 | Pavloff et al. |
| 2009/0078375 A1 | 3/2009 | Nishio et al. |
| 2009/0120462 A1 | 5/2009 | West et al. |
| 2010/0018649 A1 | 1/2010 | Nishio et al. |
| 2010/0059366 A1 | 3/2010 | Brueckner et al. |

FOREIGN PATENT DOCUMENTS

| | | |
|---|---|---|
| EP | 0239349 | 9/1987 |
| EP | 0439000 | 7/1991 |
| EP | 0601788 | 6/1994 |
| EP | 0635869 | 1/1995 |
| EP | 0791956 | 8/1997 |
| EP | 0818803 A | 1/1998 |
| EP | 0838838 | 4/1998 |
| EP | 1094496 A | 4/2001 |
| GB | 2 049 737 | 12/1980 |
| JP | 54-162969 | 12/1979 |
| JP | 58-147558 | 9/1983 |
| JP | 02-027748 | 1/1990 |
| JP | 04-367247 | 12/1992 |
| JP | 06-232243 | 8/1994 |
| JP | 07-197272 | 8/1995 |
| JP | 09-017850 | 1/1997 |
| JP | O9-041132 | 2/1997 |
| JP | 10-195644 A | 7/1998 |
| JP | S63-238269 A | 10/1998 |
| JP | 11-106904 A | 4/1999 |
| JP | 11-137440 | 5/1999 |
| JP | H11-236665 A | 8/1999 |
| JP | 2002-69695 | 3/2002 |
| JP | 2002-69696 | 3/2002 |
| JP | 2005-314773 A | 11/2005 |
| KR | 100295042 | 4/2001 |
| WO | WO-99/17336 A1 | 4/1999 |
| WO | WO-01/39250 A2 | 5/2001 |
| WO | WO 02/093624 | 11/2002 |
| WO | WO-2004/010494 A2 | 1/2004 |
| WO | WO 2005/071137 | 8/2005 |
| WO | WO 2008/079722 | 7/2008 |

OTHER PUBLICATIONS

Daviet, et al., "Electrostatic Clamping Applied to Semiconductor Plasma Processing-II. Experimental Results," J. Electrochem. Soc., 140(11):3256-3261 (Nov. 1993).

Nakasuji, et al., "Low Voltage and High Speed Operating Electrostatic Wafer Chuck," J. Vac. Sci. Technol. A, 10(6):3573-3578 (Nov./Dec. 1992).

Rosenberg, RW, "Increasing PVD Tool Uptime and Particle Control with Twin-Wire-Arc Spray Coatings", Mar. 2001, p. 103-105,108, 11, vol. 19, No. 3, Cannon Comm., Santa Monica, CA, Mar. 2001.

(56) References Cited

OTHER PUBLICATIONS

Tucker, Jr., Robert C., "Plasma and Detonation Gun Deposition Techniques and Coating Properties," Union Carbide Corp., Coatings Service Dept., Indianapolis, IN, pp. 454-489, 1986.

Watanabe, et al., "Effect of Additives on the Electrostatic Force of Alumina Electrostatic Chucks," J. of the Ceramic Soc. of Jpn., 100(1):1-6 (1992).

Watanabe, et al., "Electrostatic Force and Absorption Current of Alumina Electrostatic Chucks," Jpn. J. Appl. Phy., 31(pt1, No. 7):2145-2150 (1992).

Watanabe, et al., "Relationship Between Electrical Resistivity and Electrostatic Force of Alumina Electrostatic Chuck," Jpn. J. Appl. Phy., 32(Pt1, No. 2):864-871 (1993).

Watanabe, et al., "Resistivity and Microstructure of Alumina Ceramics Added with TiO2 Fired in Reducing Atmosphere," J. of the Ceramic Doc. of Jpn. Int. Ed., 101-1076-1083, 1993.

Wright, et al., "Low Temperature Etch Chuck: Modeling and Experimental Results of Heat Transfer and Wafer Temperature," J. Vac. Sci. Technol. A, 10(4):1065-1070(Jul./Aug. 1992.).

U.S. Appl. No. 60/739,658, to Young et al., filed Nov. 25, 2005.

Non-Final Office Action from U.S. Appl. No. 10/981,261 dated Mar. 6, 2009.

Final Office Action in U.S. Appl. No. 10/981,261 dated Dec. 16, 2008.

Non-Final Office Action in U.S. Appl. No. 10/981,261 dated Jun. 4, 2008.

Final Office Action in U.S. Appl. No. 10/981,261 dated Oct. 30, 2007.

Non-Final Office Action in U.S. Appl. No. 10/981,261 dated May 17, 2007.

Office Action dated Jun. 8, 2009 in U.S. Appl. No. 11/558,926, entitled "Sputtering target for titanium sputtering chamber".

Office Action dated Apr. 14, 2009 in U.S. Appl. No. 11/764,133, entitled "Electroformed sputtering target".

Final Office Action dated Oct. 26, 2009 in U.S. Appl. No. 11/764,133, entitled "Electroformed sputtering target".

Office Action dated Nov. 20, 2009 in U.S. Appl. No. 11/558,929, entitled "Target for sputtering chamber".

Office Action dated Dec. 15, 2008 in U.S. Appl. No. 11/444,175, entitled "Ring assembly for substrate processing chamber".

Final Office Action dated Jul. 20, 2009 in U.S. Appl. No. 11/444,175, entitled "Ring assembly for substrate processing chamber".

Properties of C18200, www.copper.org, 2005.

USPTO Office Action dated Oct. 1, 2004 in U.S. Appl. No. 10/431,399 (US 2004/0222088 A1).

USPTO Office Action dated Feb. 28, 2006 in U.S. Appl. No. 10/431,399 (US 2004/0222088 A1).

USPTO Office Action dated Aug. 14, 2006 in U.S. Appl. No. 10/431,399 (US 2004/0222088 A1).

USPTO Final Office Action dated Feb. 7, 2007 in U.S. Appl. No. 10/431,399 (US 2004/0222088 A1).

\* cited by examiner

PROCESS KIT COMPONENTS FOR TITANIUM SPUTTERING CHAMBER

CROSS-REFERENCE TO RELATED APPLICATION

This application claims priority to U.S. Provisional Application Ser. No. 60/739,658, filed Nov. 25, 2005, and U.S. Provisional Application No. 60/788,378, filed Mar. 30, 2006, both incorporated herein by reference in their entireties.

BACKGROUND

Embodiments of the present invention relate to process kit components for a titanium sputtering chamber.

In the manufacture of integrated circuits and displays, a substrate, such as a semiconductor wafer or display panel, is placed in a process chamber and processing conditions are set in the chamber to deposit or etch material on the substrate. A typical chamber comprises an enclosure wall that encloses a plasma zone, a gas supply to provide a process gas in the chamber, a gas energizer to energize gas to process the substrate, a substrate support to support a substrate, and a gas exhaust to maintain a gas pressure in the chamber. Such chambers can include, for example, sputtering or PVD, CVD, and etching chambers. In a magnetron PVD sputtering chambers, a target is sputtered in a magnetic field causing sputtered target material to deposit on a substrate facing the target. In the sputtering process, a process gas comprising an inert or reactive gas is supplied into the chamber, and the target is electrically biased while the substrate maintained at an electrical floating potential to generate charged plasma species in the chamber which sputter the target.

In one type of process, a sputtering chamber is used to deposit a layer comprising titanium or a titanium compound on a substrate for a variety of applications. For example, a sputtered titanium layer can be used as a barrier layer to inhibit the diffusion of an overlying material into the layers below the barrier layer. The titanium layers can be used by themselves, or in combination with other layers, for example, Ti/TiN stacked layers are often used as liner barrier layers, and to provide contacts to the source and drain of a transistor. In another example, a titanium layer is deposited on a silicon wafer and portions of the titanium layer in contact with the silicon are converted to titanium silicide layers by annealing. In another configuration, the diffusion barrier layer below a metal conductor, includes a titanium oxide layer formed by sputter depositing titanium on the substrate and then transferring the substrate to an oxidizing chamber to oxidize the titanium by heating it in an oxygen environment to form titanium oxide. Titanium oxide can also be deposited by introducing oxygen gas into the chamber while titanium is being sputtered. Similarly, titanium nitride can be deposited by reactive sputtering methods by introducing a nitrogen containing gas into the chamber while sputtering titanium.

Conventional sputtering targets which are shaped as right-cylinders have several problems when used for titanium sputtering. One problem arises because titanium material sputtered from the vertical sidewalls of such a target accumulate on adjacent surfaces of the chamber. The accumulated sputtered material eventually flakes off with process heating/cooling cycles to fall upon and contaminate the substrate. Also, in certain chambers, a dielectric isolator ring is located adjacent to the target to isolate the electrical potential applied to the target from the potential applied to the chamber walls and/or support. However, the sputtered titanium material accumulating on the dielectric isolator eventually forms a continuous film that can cause electrical shorts between the chamber walls and target. Another problem arises because conventional targets made by bonding a sputtering material plate onto a stainless steel backing plate, often debond from the backing plate due to thermal expansion stresses. Thus, it is desirable to have a sputtering target that provides reduced sidewall sputtering and which does not easily debond.

The sputtering chamber also includes a process kit comprising components arranged about the substrate support and chamber sidewalls to receive sputtering deposits which would otherwise accumulate on the side surfaces of the support or on the backside surface of the substrate. The process kit can include, for example, a deposition ring, cover ring, and shadow ring, located about the periphery of the substrate. The process kit can also include shields and liners which serve as a receiving surface to receive sputtering deposits which would otherwise deposit on the sidewalls of the chamber. The process kit components also reduce erosion of the internal chamber structures by the energized plasma. The components are also often designed to be easily removable for cleaning of accumulated deposits.

However, conventional process kit components often do not allow sufficient amounts of sputtered deposits to accumulate thereon. The process deposits often flake off due to thermal stresses and contaminate the substrate after a limited number of process cycles. Increasing the amount of sputtered deposits that can accumulate on these components allows a greater number of substrates to be sequentially processed in the chamber without shutting down the chamber to dismantle the components for cleaning them. Each time the chamber requires cleaning, the resultant downtime of the chamber increases the cost of processing substrates. Thus it is desirable to have process chamber components that maximize the amount of time the chamber can be operated without shutting down the chamber, especially for titanium sputtering processes. Also, the chamber components should be able to receive sputtered deposits without causing the components to stick to one another or to other components which can result in damage to the substrate or components when they are attempted to be removed from the support.

Thus it is desirable to have a sputtering target that limits the formation and deposition of sputtered material from its sidewalls on adjacent chamber surfaces. It is further desirable to have process kit components that minimize chamber down time so that the chamber can be operated to sputter deposit material on a greater number of substrates without shutting down the chamber to clean the components. It is further desirable to have process kit components that can allow deposits to accumulate on their surfaces without causing sticking of the components to each other or to the substrate.

SUMMARY

A sputtering target for a sputtering chamber comprises a backing plate and titanium sputtering plate mounted on the backing plate. The sputtering plate comprises a central cylindrical mesa having a plane, and a peripheral inclined annular rim surrounding the cylindrical mesa, the annular rim being inclined relative to the plane of the cylindrical mesa by an angle of at least about 8°.

A deposition ring is also provided for placement about a substrate support in a substrate processing chamber that has a substrate receiving surface with a plane and a peripheral wall that terminates before an overhanging edge of the substrate. The deposition ring comprises an annular band having an exposed surface surrounding the peripheral wall of the support, the exposed surface comprising a surface roughness average of 150±50 microinches. The annular band comprises an inner lip extending transversely from the annular band, the inner lip being substantially parallel to the peripheral wall of the support and terminating below the overhanging edge of the substrate. The annular band also has a raised ridge that is substantially parallel to the plane of the receiving surface of the substrate support. The annular band also has an inner open channel between the inner lip and the raised ridge, the inner open channel extending at least partially below the overhanging edge of the substrate, and a ledge radially outward of the raised ridge.

A cover ring comprises an annular plate comprising a footing which rests on a surface about the substrate support, and an exposed surface that is substantially parallel to the receiving surface of the substrate support, the exposed surface comprising a surface roughness average of 175±75 microinches. The annular plate also comprises first and second cylindrical walls that extend downwardly from the annular plate. The first cylindrical wall has a first length that is shorter than a second length of the second cylindrical wall by at least about 10%.

A ring assembly for placement about a substrate support in a sputtering chamber, comprises the deposition ring and the cover ring.

A shield assembly is capable of encircling a sputtering plate of a sputtering target. The shield comprises an upper shield comprising a support lip, and an annular band having a first cylindrical surface with a first diameter sized to encircle the sputtering plate of the sputtering target, a second cylindrical surface with a second diameter sized smaller than the first diameter, and a sloped surface between the first and second surfaces. The lower shield comprises a support ledge, a cylindrical outer band extending below the upper shield, a base plane extending radially inward from the bottom end of the cylindrical outer band, and a cylindrical inner band joined to the base plate and at least partially surrounding the substrate support.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
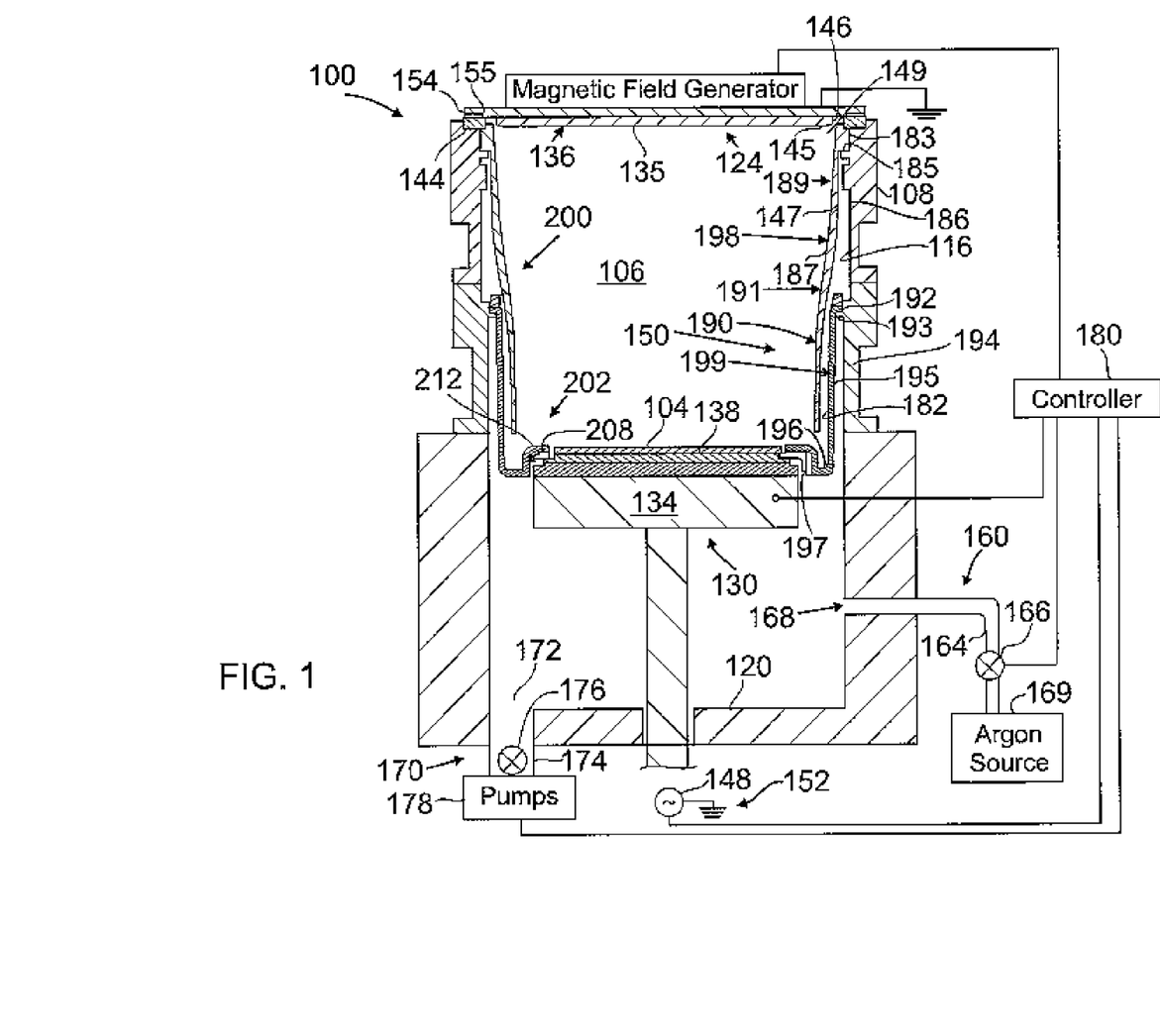
FIG. 1 is a schematic sectional side view of a sputtering chamber showing a target and process kit components comprising a cover ring, deposition ring and shield assembly.

An example of a sputtering process chamber 100 capable of processing a substrate 104 is shown in FIG. 1. The chamber 100 comprises enclosure walls 108 that enclose a plasma zone 106 and include sidewalls 116, a bottom wall 120, and a ceiling 124. The chamber 100 can be a part of a multi-chamber platform (not shown) having a cluster of interconnected chambers connected by a robot arm mechanism that transfers substrates 104 between the chambers 106. In the version shown, the process chamber 100 comprises a sputtering chamber, also called a physical vapor deposition or PVD chamber, which is capable of sputter depositing titanium on a substrate 104. However, the chamber 100 can also be used for other purposes, such as for example, to deposit aluminum, copper, tantalum, tantalum nitride, titanium nitride, tungsten or tungsten nitride; thus, the present claims should not be limited to the exemplary embodiments described herein to illustrate the invention.

Figure 4:
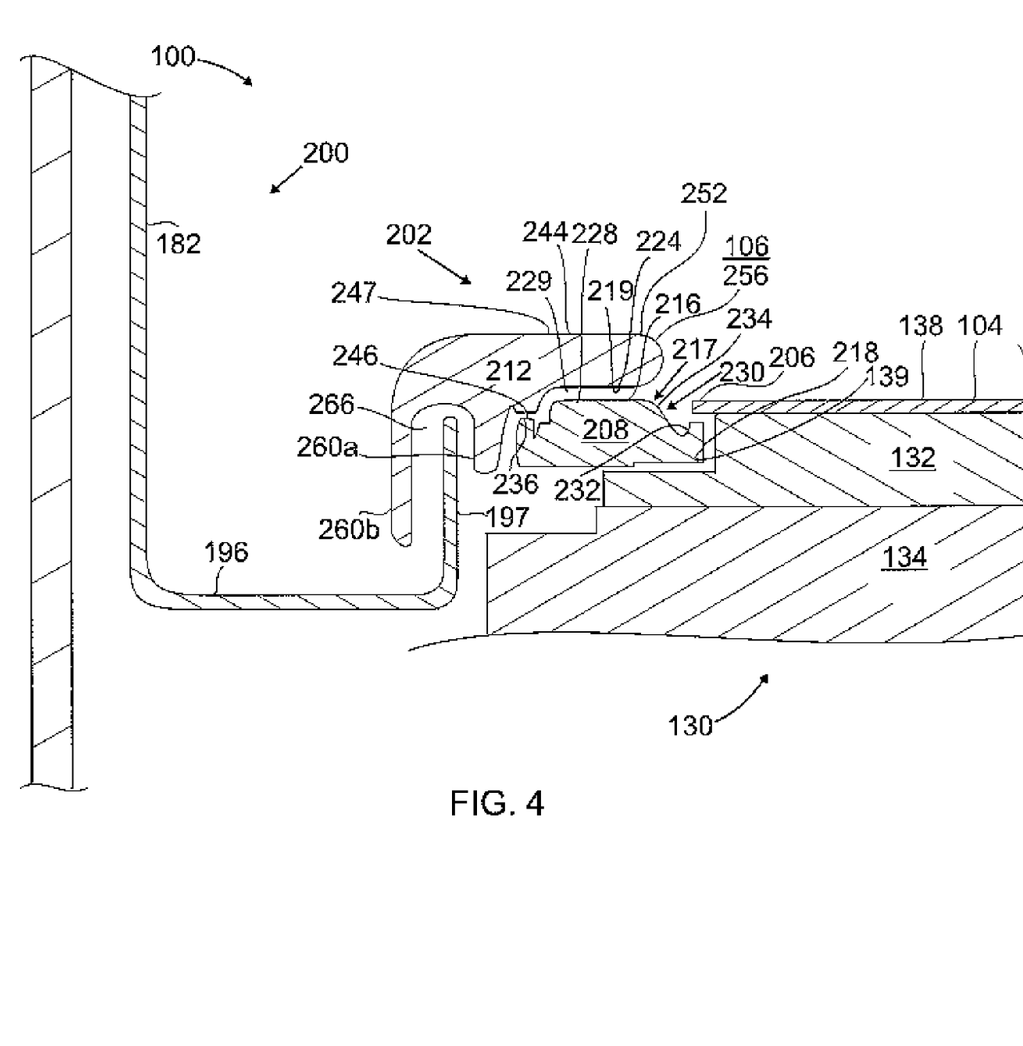
FIG. 4 is a sectional side view of the deposition ring, cover ring and lower shield around a substrate support.

The chamber 100 comprises a substrate support 130 to support the substrate 104 which comprises a pedestal 134. The pedestal 134 has a substrate receiving surface 138 that receives and supports the substrate 104 during processing, the surface 138 having a plane substantially parallel to a sputtering surface 135 of an overhead sputtering target 136. The support 130 also has a peripheral wall 139 that terminates before an overhanging edge of the substrate 104, as shown in FIG. 4. The support 130 can also include an electrostatic chuck 132 to electrostatically hold the substrate 104 and/or a heater (not shown), such as an electrical resistance heater or heat exchanger. In operation, a substrate 104 is introduced into the chamber 100 through a substrate loading inlet (not shown) in the sidewall 116 of the chamber 100 and placed on the substrate support 130. The support 130 can be lifted or lowered to lift and lower the substrate onto the support 130 during placement of a substrate 104 on the support 130. The pedestal 134 can be maintained at an electrically floating potential or grounded during plasma operation.

Figure 2:
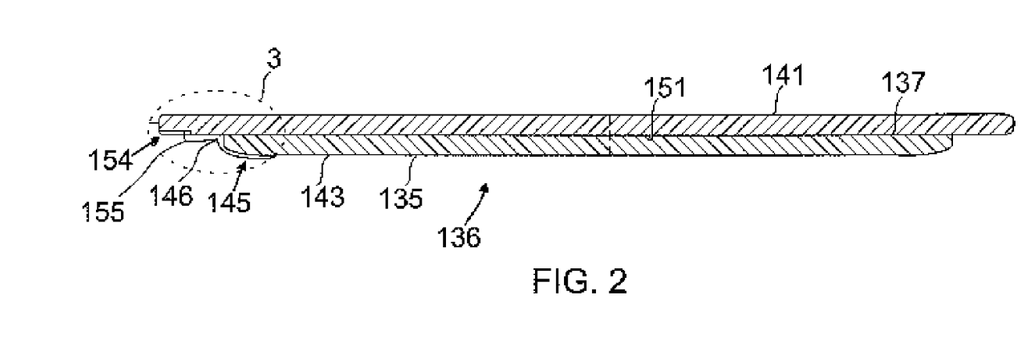
FIG. 2 is a sectional side view of a titanium sputtering target suitable for the chamber of FIG. 1.
Figure 3:
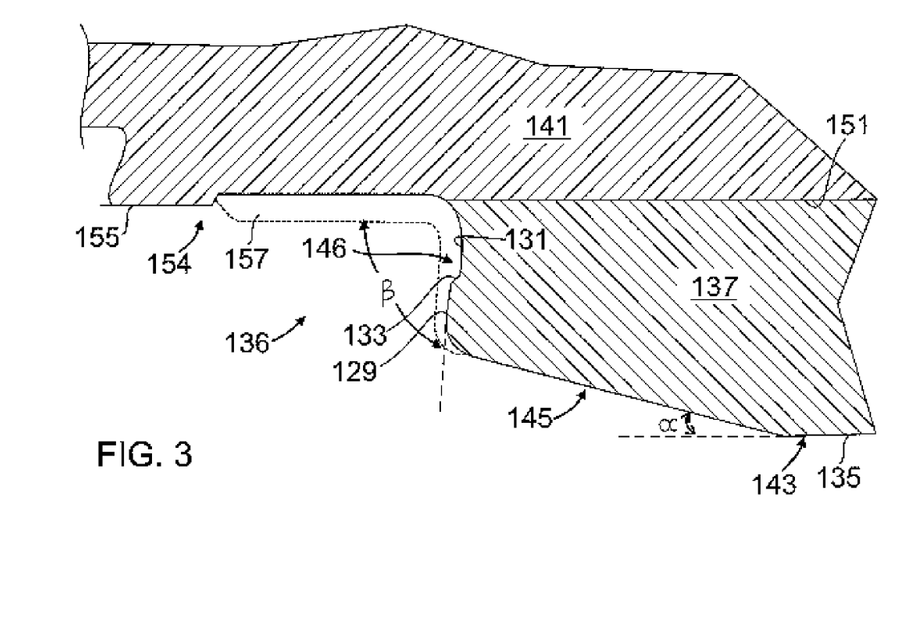
FIG. 3 is a detail (3) of the sectional side view of the sputtering target shown in FIG. 2.

The sputtering surface 135 of the sputtering target 136 facing the substrate 104, comprises the titanium material to be sputtered onto the substrate 104. Referring to FIGS. 2 and 3, the sputtering target 136 comprises a titanium sputtering plate 137 mounted on a backing plate 141. In one version, the titanium sputtering plate 137 comprises a central cylindrical mesa 143 having the sputtering surface 135 that forms a plane that is parallel to the plane of the substrate 104. A peripheral inclined annular rim 145 surrounds the cylindrical mesa 143. The annular rim 145 is inclined relative to the plane of the cylindrical mesa 143 by an angle a of at least about 8°, for example, from about 10° to about 20°, for example, 15°. A peripheral inclined sidewall 146 having a step 133 surrounds the annular rim 145. The peripheral sidewall 146 is inclined relative to the plane of the cylindrical mesa 143 by an angle β of at least about 60°, for example, from about 75° to about 85°. The step 133 occurs between a slightly protruding first slope 129 and a slightly recessed second slope 131, the step 133 joining the surfaces 129, 131 at a cutback angle of about 35. The complex shape of the peripheral annular rim 145 and sidewall 146 that is adjacent to the upper shield 147 forms a convoluted gap 149 that serves as a labyrinth that impedes the passage of sputtered or plasma species through the gap 149. The titanium sputtering plate 137 comprises titanium in a purity of at least about 99.9%, or even at least about 99.99% purity.

The backing plate 141 comprises a support surface 151 to support the sputtering plate 137 and has a peripheral ledge 154 that extends beyond the radius of the sputtering plate 137. The peripheral ledge 154 comprises an outer footing 155 that rests on an isolator 144 in the chamber 100, as shown in FIG. 1. The isolator 144 electrically isolates and separates the backing plate 141 from the chamber 100, and is typically a ring made from a ceramic material, such as aluminum oxide. The peripheral ledge 154 is shaped to inhibit the flow or migration of sputtered material and plasma species through the gap 149 between the target 136 and the isolator 144, to impede the penetration of low-angle sputtered deposits into the gap 149. The backing plate 141 can be made from stainless steel or aluminum. In a preferred version, the backing plate 141 comprises an alloy composed of copper and zinc, which comprises for example, copper in an amount of from about 59 to about 62 wt % and zinc in an amount of from about 38% to about 41%.

The sputtering plate 137 is mounted on the backing plate 141 by diffusion bonding by placing the two plates 137, 141 on each other and heating the plates to a suitable temperature, typically at least about 200° C. Also, the peripheral edge 154 of the target 136 can be coated with a protective coating, for example, a twin-wire arc sprayed aluminum coating 157. Before coating, the peripheral edge 154 is degreased and ground with a silicon carbide disc to achieve a roughness of 200 to 300 microinches. The coating 157 extends to cover the peripheral sidewall 146 of the sputtering plate 137 and the peripheral ledge 154 of the backing plate 141. The coating 151 has a final surface roughness of 700±200 microinches, and a thickness of from about 5 to about 10 mils. The coating 157 protects the edges of the target 136 provides better adhesion of the sputtered material and reduces flaking of the material from these surfaces.

Referring back to FIG. 1, the target 136, support 130, and upper shield 147 are electrically biased relative to one another by a power supply 148. The target 136, upper shield 147, support 130, and other chamber components connected to the target power supply 148 operate as a gas energizer 152 to form or sustain a plasma of the sputtering gas. The gas energizer 152 can also include a source coil (not shown) that is powered by the application of a current through the coil. The plasma formed in the plasma zone 106 energetically impinges upon and bombards the sputtering surface 135 of the target 136 to sputter material off the surface 135 onto the substrate 104.

The sputtering gas is introduced into the chamber 100 through a gas delivery system 160 provides gas from a gas supply 162 via conduits 164 having gas flow control valves 166, such as a mass flow controllers, to pass a set flow rate of the gas therethrough. The gases are fed to a mixing manifold (also not shown) in which the gases are mixed to form a desired process gas composition and fed to a gas distributor 168 having gas outlets in the chamber 100. The process gas source 169 may comprise a non-reactive gas, such as argon or xenon, which is capable of energetically impinging upon and sputtering material from a target. The process gas source 169 may also include a reactive gas, such as one or more of an oxygen-containing gas and a nitrogen-containing gas, that are capable of reacting with the sputtered material to form a layer on the substrate 104. Spent process gas and byproducts are exhausted from the chamber 100 through an exhaust 170 which includes exhaust ports 172 that receive spent process gas and pass the spent gas to an exhaust conduit 174 having a throttle valve 176 to control the pressure of the gas in the chamber 100. The exhaust conduit 174 is connected to one or more exhaust pumps 178. Typically, the pressure of the sputtering gas in the chamber 100 is set to sub-atmospheric levels, such as a vacuum environment, for example, gas pressures of 1 mTorr to 400 mTorr.

The chamber 100 is controlled by a controller 180 that comprises program code having instruction sets to operate components of the chamber 100 to process substrates 104 in the chamber 100. For example, the controller 180 can comprise program code that includes a substrate positioning instruction set to operate the substrate support 130 and substrate transport; a gas flow control instruction set to operate gas flow control valves 166 to set a flow of sputtering gas to the chamber 100; a gas pressure control instruction set to operate the throttle valve 174 to maintain a pressure in the chamber 100; a gas energizer control instruction set to operate the gas energizer 152 to set a gas energizing power level; a temperature control instruction set to control a temperature control system (not shown) in the support 134 or wall 108 to set temperatures of the substrate 104 or walls 108, respectively; and a process monitoring instruction set to monitor the process in the chamber 100.

The chamber further comprises a process kit 200 comprising various components that can be easily removed from the chamber 100, for example, to clean sputtering deposits off the component surfaces, replace or repair eroded components, or to adapt the chamber for other processes. In one version, the process kit 200 comprises a ring assembly 202 for placement about a peripheral wall 139 of the substrate support 130 that terminates before an overhanging edge 206 of the substrate, as shown in FIG. 4. The ring assembly 202 comprises a deposition ring 208 and a cover ring 212 that cooperate with one another to reduce formation of sputter deposits on the peripheral walls 139 of the support 130 or the overhanging edge 206 of the substrate 104.

The deposition ring 208 can be easily removed to clean sputtering deposits from the exposed surfaces of the ring so that the support 130 does not have to be dismantled to be cleaned. The deposition ring 208 protects the exposed side surfaces of the support 130 to reduce their erosion by the energized plasma species. In the version shown in FIG. 4, the deposition ring 208 comprises an annular band 216 that extends about and surrounds the peripheral wall 139 of the support 130. The annular band 216 comprises an inner lip 218 which extends transversely from the band and is substantially parallel to the peripheral wall 139 of the support 130. The inner lip 218 terminates immediately below the overhanging edge 206 of the substrate 104. The inner lip 218 defines an inner perimeter of the deposition ring 208 which surrounds the periphery of the substrate 104 and support 130 to protect regions of the support 130 that are not covered by the substrate 104 during processing. For example, the inner lip 218 surrounds and at least partially covers the peripheral wall 139 of the support 130 that would otherwise be exposed to the processing environment to reduce or even entirely preclude deposition of sputtering deposits on the peripheral wall 139.

The annular band 216 of the deposition ring 208 also has a raised ridge 224 that extends along the central portion of the band 216. The raised ridge 224 has a flat top surface 228 that is substantially parallel to the plane of the receiving surface 138 of the substrate support 130, and spaced apart from the cover ring 212 to form a narrow gap 229 therebetween. The narrow gap acts as a labyrinth to reduce penetration of plasma species into the gap or the regions at the end of the gap. of the raised ridge. An open inner channel 230 lies between the inner lip 218 and the raised ridge 224. The open inner channel 230 extends radially inward to terminate at least partially below the overhanging edge 206 of the substrate 104. The inner channel 230 has a first rounded corner 232 joining to the inner lip 218 and a gently sloped surface 234 joining to the raised ridge 224. The smooth corner 232 and sloped surface 234 facilitate the removal of sputtering deposits from these portions during cleaning of the deposition ring 208. The deposition ring 208 also has a ledge 236 which extends radially outward of the raised ridge 224, and serves to support the cover ring 212. Unlike prior art designs, pins are not needed in the deposition ring 208 to retain the substrate 104 in the event that the substrate 104 slides or is misplaced in the chamber 100, due to accurate positioning of the substrate in the chamber during its transportation into the chamber.

In one version, the deposition ring 208 is made by shaping and machining a ceramic material, such as aluminum oxide. Preferably, the aluminum oxide has a purity of at least about 99.5%, to reduce contamination of the chamber by undesirable elements such as iron. The ceramic material is molded and sintered using conventional techniques such as isostatic pressing, followed by machining of the molded sintered preformed using suitable machining methods to achieve the shape and dimensions required.

In one preferred version, the annular band 216 of the deposition ring 208 comprises an exposed surface 217 that is bead blasted to achieve a predefined level of surface roughness while adjacent surfaces are masked off to prevent accidental bead blasting of these surfaces. In the bead blasting process, aluminum oxide grit is blasted through a nozzle of a grit blaster (not shown) toward the exposed surface of the deposition ring. The grit blaster can be a pressure driven grit blaster which is powered using compressed gas at a pressure of from about 20 to about 45 psi. Alternatively, a siphon driven grit blaster can be used at an operating pressure of from about 60 to about 80 psi. The nozzle of the grit blaster is maintained at an angle of about 45° relative to the plane of the exposed surface, and at a distance of about four to 6 inches. Grit blasting is performed with a grit size suitable to achieve the predefined surface roughness. The grit blasted surface roughness average of 150±50 microinches provides a suitable surface for strong adhesion of sputtered titanium deposits.

The surface roughness average is the mean of the absolute values of the displacements from the mean line of the peaks and valleys of the roughness features along the exposed surface. The roughness average, skewness, or other properties may be determined by a profilometer that passes a needle over the exposed surface 217 and generates a trace of the fluctuations of the height of the asperities on the surface, or by a scanning electron microscope that uses an electron beam reflected from the surface to generate an image of the surface. To measure the surface roughness average, the exposed surface of a test deposition ring 208 can be cut into coupons and one or more measurements are made on each coupon. These measurements are then averaged to determine an average surface roughness of the exposed surface 217. In one embodiment, three coupons are used and four traces of the changes in the heights of the peaks and valleys of the features of the surface roughness are made on each coupon.

The cover ring 212 of the ring assembly 202 comprises an undersurface 219 that is spaced apart from, overlies, and at least partially covers the raised ridge 224 of the deposition ring 208 to define the narrow gap 229 which impedes travel of plasma species through the gap. The constricted flow path of the narrow gap 229 restricts the build-up of low-energy sputter deposits on the mating surfaces of the deposition ring 208 and cover ring 212, which would otherwise cause them to stick to one another or to the peripheral overhang edge 206 of the substrate 104.

The cover ring 212 comprises an annular plate 244 which has a footing 246 which rests on a surface about the substrate support 130, such as on the ledge 236 of the deposition ring 208. The footing 246 extends downwardly from the plate 244 to press against the ledge 236 on the deposition ring 208. The annular plate 244 serves as a boundary to contain the sputtering plasma within the process zone between the target 136 and the support 130, receives the bulk of the sputtering deposits, and shadows the deposition ring 208. The annular plate terminates in a projecting brim 252 which overlies the raised ridge 224 of the deposition ring 208. The projecting brim 252 terminates in a rounded edge 256 and has a planar bottom surface 260 which is the undersurface of the cover ring. The projecting brim 252 inhibits the deposition of sputtering deposits on the overhang edge 206 of the substrate and also reduces deposits on the peripheral walls 139 of the support 130.

The cover ring 212 also has a pair of cylindrical walls 260a,b that extend downwardly from the annular plate 244. The cylindrical walls 260a,b are located radially outward of the footing 246 of the wedge 244. The inner cylindrical wall 260a has a smaller length than the outer wall 260b. For example, the inner wall 260a can have a first length that is shorter than a second length of the outer wall 260b second leg by at least about 10%. The walls 260a, 260b are spaced apart to form yet another convoluted pathway 266 which impedes travel of plasma species and glow discharges to the surrounding area. In one version, the inner wall 260a has a length of about 0.7 inches.

The cover ring 212 is fabricated from a material that can resist erosion by the sputtering plasma, for example, a metallic material such as stainless steel, titanium or aluminum; or a ceramic material, such as aluminum oxide. In one version, the cover ring 212 is made from stainless steel and has an exposed surface 247 that is substantially parallel to the receiving surface 138 of the substrate support 130. The exposed surface 247 is bead blasted to obtain a surface roughness of 175±75 microinches. The bead blasted surface is prepared in the same manner as the bead blasting process for the exposed surface 217 of the deposition ring 208 as described above with suitable modifications to the grit size to achieve the desired roughness values.

The process kit 200 can also includes a shield assembly 150 that encircles the sputtering surface of a sputtering target 136 and the peripheral edge 139 of the substrate support 130, as shown in FIG. 1, to reduce deposition of sputtering deposits on the sidewalls 116 of the chamber 100 and the lower portions of the support 130. The shield assembly 150 reduces deposition of sputtering material on the surfaces of support 130, and sidewalls 116 and bottom wall 120 of the chamber 100, by shadowing these surfaces. In one version, the shield assembly 150 comprises an upper shield 147 and a lower shield 182 that cooperate together to shadow the wall surfaces and lower portion of the chamber 100. The upper shield 147 comprises a support lip 183 which rests on a ledge 185 of an upper adapter 186 in the chamber. The upper adapter 186 can serve as the sidewall of the chamber 100. The upper shield 147 also has an annular band 187 with a first cylindrical surface 189 having a first diameter sized to encircle the sputtering plate of the sputtering target, a second cylindrical surface 190 with a second diameter sized smaller than the first diameter, and a sloped surface 191 between the first and second surfaces 189, 190.

The lower shield 182 also has a support ledge 192 which rests on a circumferential lip 193 of the lower adapter 194 to support the lower shield 182. The lower shield 182 comprises a cylindrical outer band 195 that extends below the second cylindrical surface 190 of the upper shield 147, a base plate 196 that extends radially inward from the bottom end of the cylindrical outer band 195, and a cylindrical inner band 196 joined to the base plate 195 which at least partially surrounds the substrate support 130, as shown in FIG. 4. The inner band 196 comprises a height that is smaller than the outer band 195, for example, the inner band 196 can have a height which is 0.8 times smaller than the height of the outer band 195. The gaps between the inner and outer bands 196, 195, respectively, and the outer wall 260b and inner wall 260a of the cover ring 212 serve to hinder and impede ingress of plasma species into this region.

The upper and lower shields 147, 182 are fabricated from a conductor, such as a metal, for example, aluminum. In one version, the shields 147, 182 have exposed surfaces 198, 199, respectively, facing the plasma zone 106 in the chamber 100. The exposed surfaces 198, 199 are bead blasted to have a surface roughness of 175±75 microinches. The bead blasted surface is prepared in the same manner as the bead blasting process used for the exposed surface 217 of the deposition ring 208 as described above with suitable modifications to the grit size to achieve the desired roughness values.

The design of the components of the process kit 200 and the target 136 significantly increase the number of process cycles and process on-time that the process kit can be used in the chamber without removing the process kit for cleaning in the sputtering of titanium. The components of the process kit 200 and target 136 are also designed to allow increased power and pressure in the sputtering zone 106 to yield higher deposition throughput by reducing the temperature in the darkspace region which is near the upper shield 147 and target 136. The present invention has been described with reference to certain preferred versions thereof; however, other versions are possible. For example, the process kit 200 can be used in other types of applications, as would be apparent to one of ordinary skill, for example, etching, CVD and etching chambers. Other shapes and configurations of the target 136, deposition ring 208, cover ring 212, and shield assembly 150 can also be used. Therefore, the spirit and scope of the appended claims should not be limited to the description of the preferred versions contained herein.

What is claimed is:

1. A deposition ring for placement about a substrate support in a sputtering chamber, the substrate support comprising a substrate receiving surface having a plane and a peripheral wall that terminates before an overhanging edge of a substrate received on the substrate receiving surface, the deposition ring comprising:
    (a) an annular band surrounding the peripheral wall of the support, the annular band being composed of a material and having an exposed surface that is a roughened surface of the material,. the annular band comprising:
        (i) an inner lip extending transversely from the annular band, the inner lip being substantially parallel to the peripheral wall of the support and terminating below the overhanging edge of the substrate;
        (ii) a raised ridge that is substantially parallel to the plane of the receiving surface of the substrate support;
        (iii) an inner open channel between the inner lip and the raised ridge, the inner open channel extending at least partially below the overhanging edge of the substrate; and
        (iv) a ledge radially outward of the raised ridge.

2. A ring according to claim 1 wherein the annular band is composed of aluminum oxide.

3. A ring according to claim 2 wherein the aluminum oxide has a purity of at least about 99.5%.

4. A ring according to claim 1 wherein the exposed roughened surface of the material comprises a surface roughness average of 150±50 microinches.

5. A ring assembly comprising a deposition ring according to claim 1 and further comprising a cover ring, wherein the raised ridge of the annular band of the deposition ring and a spaced apart and overlying undersurface of the cover ring, define a narrow gap which impedes travel of plasma species through the gap.

(a) a deposition ring comprising an annular band surrounding the peripheral wall of the support, the annular band composed of a material and having an exposed surface that is a roughened surface of the material, the annular band comprising:
        (i) an inner lip extending transversely from the annular band, the inner lip being substantially parallel to the peripheral wall of the support and terminating below the overhanging edge of the substrate;
        (ii) a raised ridge that is substantially parallel to the plane of the receiving surface of the substrate support;
        (iii) an inner open channel between the inner lip and the raised ridge, the inner open channel extending at least partially below the overhanging edge of the substrate; and
        (iv) a ledge radially outward of the raised ridge; and
    (b) a cover ring at least partially covering the deposition ring, the cover ring comprising:
        (i) an annular plate composed of a material and comprising a footing which rests on a surface about the substrate support, the annular plate having an exposed surface that is a roughened surface of the material and substantially parallel to the receiving surface of the substrate support; and
        (ii) first and second cylindrical walls extending downwardly from the annular plate, the first cylindrical wall having a first length that is shorter than a second length of the second cylindrical wall by at least about 10%.

6. A ring according to claim 1 wherein the inner open channel of the annular band comprises a rounded corner that is joined to the inner lip.

7. A ring according to claim 1 wherein the inner open channel of the annular band comprises a sloped surface that is joined to the raised ridge.

8. A ring assembly according to claim 5 wherein the ledge of the annular band comprises a surface to support the cover ring.

9. A ring assembly according to claim 5 wherein the cover ring comprises an annular plate having a footing which rests on a surface about the substrate support.

10. A ring assembly according to claim 9 wherein the annular plate is composed of a material and has an exposed surface that is a roughened surface of the material.

11. A ring assembly according to claim 9 wherein the annular plate comprises downwardly extending first and second cylindrical walls, the first cylindrical wall having a first length that is shorter than a second length of the second cylindrical wall.

12. A ring assembly according to claim 11 wherein the first length is shorter than the second length by at least 10%.

13. A ring assembly according to claim 5 wherein the annular plate is composed of stainless steel.

14. A ring assembly according to claim 5 wherein the annular plate comprises an exposed surface that is a bead blasted surface.

15. A deposition ring according to claim 1 wherein the roughened surface of the material comprises a bead blasted exposed surface with a surface roughness average of 150±50 microinches.

16. A ring assembly according to claim 10 wherein the roughened surface of the material comprises a bead blasted exposed surface with a surface roughness average of 175±75 microinches.

* * * * *